United States Patent [19]

Blakeney et al.

[11] Patent Number: 5,024,921
[45] Date of Patent: Jun. 18, 1991

[54] THERMALLY STABLE LIGHT-SENSITIVE COMPOSITIONS WITH O-QUINONE DIAZIDE AND PHENOLIC RESIN USED IN A METHOD OF FORMING A POSITIVE PHOTORESIST IMAGE

[75] Inventors: Andrew J. Blakeney, Seekonk, Mass.; Alfred T. Jeffries, III; Thomas R. Sarubbi, both of Providence, R.I.

[73] Assignee: OCG Microelectronic Materials, Inc., Cheshire, Conn.

[21] Appl. No.: 552,394

[22] Filed: Sep. 21, 1990

Related U.S. Application Data

[62] Division of Ser. No. 325,399, Mar. 20, 1989, Pat. No. 4,970,287, which is a division of Ser. No. 124,227, Nov. 23, 1987, Pat. No. 4,837,121.

[51] Int. Cl.$^5$ ............... G03C 5/18; G03C 1/60; G03C 1/54
[52] U.S. Cl. ..................... 430/326; 430/165; 430/189; 430/191; 430/192; 430/193; 430/330
[58] Field of Search ............ 430/326, 192, 191, 165, 430/166, 175

[56] References Cited

U.S. PATENT DOCUMENTS

| | | | |
|---|---|---|---|
| 3,023,251 | 2/1962 | Meyers | 260/621 |
| 3,038,882 | 6/1962 | Gavlin et al. | 260/59 |
| 3,046,110 | 7/1962 | Schmidt | 96/33 |
| 3,046,111 | 7/1962 | Schmidt | 96/33 |
| 3,046,112 | 7/1962 | Schmidt et al. | 96/33 |
| 3,046,114 | 7/1962 | Sus | 96/33 |
| 3,046,115 | 7/1962 | Schmidt et al. | 96/33 |
| 3,046,116 | 7/1962 | Schmidt | 96/33 |
| 3,046,118 | 7/1962 | Schmidt | 96/33 |
| 3,046,121 | 7/1962 | Schmidt | 96/33 |
| 3,046,122 | 7/1962 | Sus | 96/33 |
| 3,046,123 | 7/1962 | Sus et al. | 96/33 |
| 3,384,618 | 5/1968 | Imoto et al. | |
| 3,635,709 | 1/1972 | Kobayashi et al. | 96/33 |
| 4,009,033 | 2/1977 | Bakos et al. | 96/33 |
| 4,013,605 | 3/1977 | Hultzsch et al. | 260/29.3 |
| 4,061,620 | 12/1977 | Gillern | 260/29.3 |
| 4,076,873 | 2/1978 | Shea | 428/35 |
| 4,211,834 | 7/1980 | Lapadula et al. | 96/36 |
| 4,259,430 | 3/1981 | Kaplan et al. | 430/191 |
| 4,306,010 | 12/1981 | Uehara et al. | 430/190 |
| 4,368,299 | 1/1983 | Watanabe et al. | 525/481 |
| 4,376,854 | 3/1983 | Yamaguchi et al. | 528/155 |
| 4,377,631 | 3/1983 | Toukhy et al. | 430/192 |
| 4,387,152 | 6/1983 | Stahlhofen | 430/192 |
| 4,397,937 | 8/1983 | Clecak et al. | 430/192 |
| 4,404,272 | 9/1983 | Stahlhofen | 430/175 |
| 4,460,674 | 7/1984 | Uehara et al. | 430/190 |
| 4,477,553 | 10/1984 | Yamamoto et al. | 430/192 |
| 4,536,464 | 8/1985 | Nagashima et al. | 430/192 |
| 4,548,688 | 10/1985 | Matthews | 204/159.18 |
| 4,551,407 | 11/1985 | Sanders et al. | 430/138 |
| 4,614,826 | 12/1986 | Katayama et al. | 549/559 |
| 4,642,282 | 2/1987 | Stahlhofen | 430/192 |

FOREIGN PATENT DOCUMENTS 227487 7/1987 European Pat. Off. .

OTHER PUBLICATIONS

Chemical Abstracts 79:67646q-93:27245r-82:16304-7c-101:161293s-101:120523y-101:120524z-104:99528d.
Noller, "Textbook of Organic Chemistry", 2nd Ed., W. B. Saunders Co., 1958, pp. 390–391.
Morrison and Boyd, "Organic Chemistry", 3rd Ed. (1973), Allyn and Bacon, Inc., pp. 337–344.

*Primary Examiner*—Charles L. Bowers, Jr.
*Assistant Examiner*—John S. Y. Chu
*Attorney, Agent, or Firm*—William A. Simons

[57] ABSTRACT

A phenolic resin composition comprising units of formula (I):

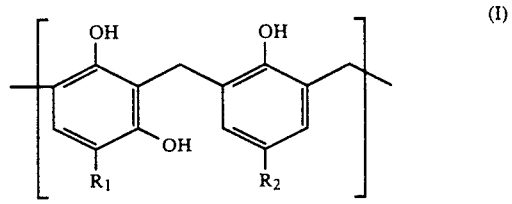

wherein $R_1$ is a halogen and $R_2$ is a lower alkyl group having 1 to 4 carbon atoms and said units of formula (I) are made by condensing the corresponding halogen-substituted resorcinol of formula (A):

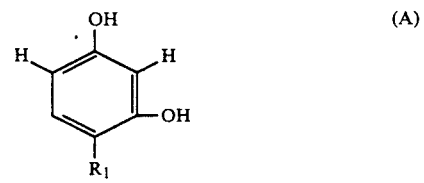

wherein $R_1$ is defined above, with the corresponding para-lower alkyl-substituted 2,6-bis(hydroxymethyl)-phenol of formula (B):

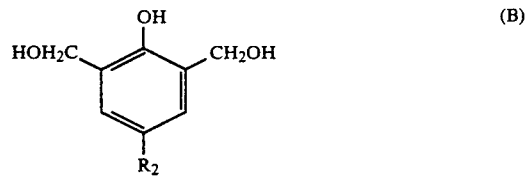

wherein $R_2$ is defined above, and wherein the mole ratio of A:B is from about 0.5:1 to 1.7:1. This phenolic resin may be mixed with photoactive compounds (e.g. 1,2-napthoquinone diazide sensitizers) to prepare a light-sensitive composition useful in a method for forming a positive photoresist image.

3 Claims, No Drawings

THERMALLY STABLE LIGHT-SENSITIVE COMPOSITIONS WITH O-QUINONE DIAZIDE AND PHENOLIC RESIN USED IN A METHOD OF FORMING A POSITIVE PHOTORESIST IMAGE

This application is a division of application Ser. No. 07/325,399, filed Mar. 20, 1989, U.S. Pat. No. 4,970,287 division of application Ser. No. 07/124,227, filed Nov. 23, 1987, which issued as U.S. Pat. No. 4,837,121 on June 6, 1989.

BACKGROUND OF THE INVENTION

1. Field of the Invention

The present invention relates to selected thermally stable phenolic resins and their use in light-sensitive compositions. In particular, the present invention relates to phenolic resins containing at least one unit which is a condensation products of selected para lower alkyl-substituted 2,6-bis(hydroxymethyl)-phenols with selected halogen-substituted resorcinol compounds. Furthermore, the present invention relates to light-sensitive compositions useful as positive-working photoresist compositions, particularly, those containing these resins and o-quinonediazide photosensitizers. Still further, the present invention also relates to substrates coated with these light-sensitive compositions as well as the process of coating, imaging and developing these light-sensitive mixtures on these substrates.

2. Description of Related Art

Photoresist compositions are used in microlithography processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions—negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less are necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

One drawback with positive-working photoresists known heretofore is their limited resistance to thermal image deformation. This limitation is becoming an increasing problem because modern processing techniques in semiconductor manufacture (e.g. plasma etching, ion bombardment) require photoresist images which have higher image deformation temperatures (e.g. 150° C.–200° C.). Past efforts to increase thermal stability (e.g. increased molecular weight) generally caused significant decrease in other desirable properties (e.g. decreased photospeed or diminished adhesion or reduced contrast).

Accordingly, there is a need for improved positive-working photoresist formulations which produce images that are resistant to thermal deformation at temperatures of about 150° to 200° C. while maintaining the other desired properties (e.g. photospeed) at suitable levels. The present invention is believed to be an answer to that need.

SUMMARY OF THE INVENTION

Accordingly, the present invention is directed to a phenolic resin composition comprising at least one unit of formula (I):

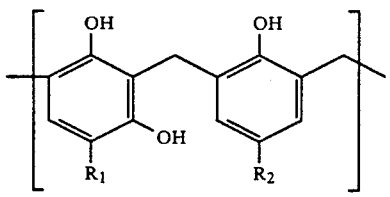

wherein $R_1$ is a halogen and $R_2$ is a lower alkyl group having 1 to 4 carbon atoms and said unit or units of formula (I) are made by condensing the corresponding halogen-substituted resorcinol of formula (A):

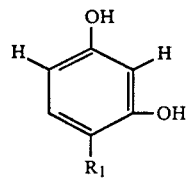

wherein $R_1$ is defined above, with the corresponding para-lower alkyl-substituted 2,6-bis(hydroxymethyl)-phenol of formula (B):

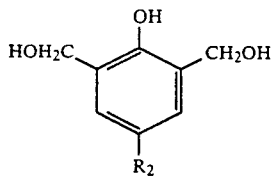

wherein $R_2$ is defined above, and wherein the mole ratio of A:B is from about 0.5:1 to 1.7:1.

Moreover, the present invention is directed to a photosensitive composition comprising an admixture of o-quinonediazide compound and binder resin comprising at least one unit of the formula (I), above; the amount of said o-quinonediazide compound or compounds being about 5% to about 30% by weight and the amount of said binder resin being about 60% to 95% by weight, based on the total solid content of said photosensitive composition.

Still further, the present invention also encompasses the process of coating substrates with these light-sensitive compositions and then imaging and developing these coated substrates.

Also further, the present invention encompasses said coated substrates (both before and after imaging) as novel articles of manufacture.

DETAILED DESCRIPTION

The resins containing the units of formula (I) are preferably made by reacting the halogen-substituted (i.e. F, Cl, Br or I) resorcinol compound of formula (A) with the para-lower alkyl-substituted 2,6-bis(hydroxymethyl)-phenol compound of formula (B), preferably in the presence of an acid catalyst. Suitable acid catalysts include those commonly employed in acid condensation-type reactants such as HCl, $H_3PO_4$, $H_2SO_4$, oxalic acid and organic sulfonic acids. The most preferred acid catalysts are the organic sulfonic acids (e.g. p-toluene sulfonic acid). Generally, it is also preferred to carry out the condensation polymerization in the presence of an organic solvent. Suitable solvents include toluene, ethanol, tetrahydrofuran, cellosolve acetate, 1-methoxy-2-propanol and 2-ethoxy ethanol. Preferred solvents are water-soluble solvents such as ethanol, 1-methoxy-2-propanol and 2-ethoxy ethanol.

As stated above, the mole ratio of A:B may be from about 0.5:1 to about 1.7:1. The preferable mole ratio of A:B is from about 0.7:1 to about 1.3:1. When A is in molar excess, resins containing the units of formula (I) will more likely be terminated with A. When B is used in molar excess, resins containing the units of formula (I) will more likely be terminated with B.

It should be noted that this condensation polymerization reaction results in ortho-, ortho-bonding between each phenolic structure. It is believed this ortho-, ortho-bonding strongly influences the high thermal stability of these resins. Furthermore, the particular positioning of the hydroxy groups on the resin backbone is believed to positively affect the strong alkali solubility characteristics.

In making the present class of resins, the precursors (A) and (B) as defined above are preferably placed in the reaction vessel preferably along with the acid catalyst and solvent. The mixture is then preferably heated to a temperature in the range from about 60° C. to about 120° C., more preferably from about 65° C. to about 95° C., for the condensation polymerization reaction to occur. The reaction time will depend on the specific reactants used and the reaction temperature. Times from 3 to 5 hours are generally suitable.

The most preferred precursor of formula (A) is 4-chlororesorcinol and the most preferred precursor of formula (B) is 2,6-bis(hydroxymethyl)-p-cresol. When these two precursors are employed, the resultant resin will contain units of formula (IA):

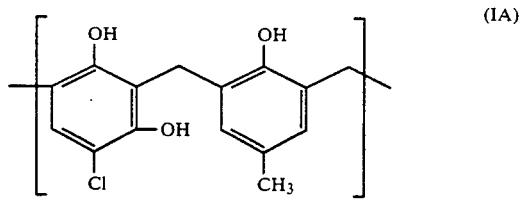

Generally, it is preferable to make resins which contain only units of formula (I), most preferably of formula (IA); however, for some applications it may be desirable to add another phenolic compound which will condense with the lower alkyl-substituted 2,6-bis(hydroxymethyl)-phenol compound of formula (B). One such suitable phenolic compound is selected from meta- or para-alkoxy substituted phenols of formula (C):

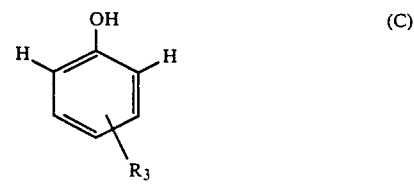

wherein $R_3$ is a lower alkoxy group having 1 to 4 carbon atoms. Thus, when (C) is condensed with (B), the phenolic resins described above have further units of formula (II):

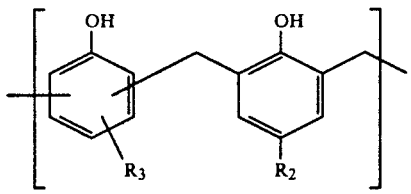

The most preferred compounds of formula (C) are para- and meta-methoxyphenol. When these two compounds are condensated with the most preferred compound of (B), namely, 2,6-bis(hydroxymethyl).para-cresol, the resultant resins will contain units of either formula (IIA) or formula (IIB):

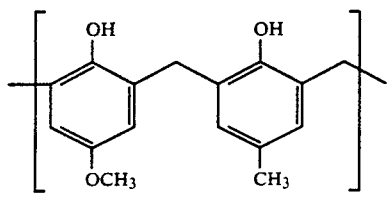

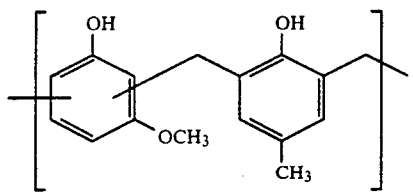

With the units represented by formula (IIA), ortho-, ortho-bonding occurs because the methoxy group is in the para position. With the units represented by formula (IIB), a mixture of ortho-, ortho-bonding and ortho-, para-bonding may occur because the methoxy group is in a meta position.

Regardless of the presence or absence of the further units of formula (II), the resins of the present invention preferably have a molecular weight of from about 500 to about 10,000, more preferably from about 750 to about 5,000. The preferred resins have at least about 40% by weight of the units of formula (I). When resins containing formula (II) are desired, they preferably contain from about 40% to about 80% by weight of units of formula (I) and about 60% to about 20% by weight of units of formula (II).

The above-discussed resins of the present invention may be mixed with photoactive compounds to make light-sensitive mixtures which are useful as positive acting photoresists. The preferred class of photoactive compounds (sometimes called light sensitizers) is o-quinonediazide compounds particularly esters derived from polyhydric phenols, alkyl-polyhydroxyphenones, aryl-polyhydroxyphenones, and the like which can contain up to six or more sites for esterification. The most preferred o-quinonediazide esters are derived from 2-diazo-1,2-dihydro-1-oxonaphthlene-4-sulfonic acid and 2-diazo-1,2-dihydro-1-oxo-naphthalene-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 24-naphthoquinone-diazide-4-sulfonic acid esters, 2,3,4-trihydroxy-benzophenone 1,2-naphthoquinonediazide-4-sulfonic acid esters, 2,3,4-trihydroxybenzophenone 1,2-naphthoquinone-diazide-5-sulfonic acid esters, 2,4,6-trihydroxy-benzophenone 1,2-naphthoquinonediazide-4-sulfonic acid esters, 2,4,6-trihydroxybenzophenone 1,2-naphthoquinone-diazide-5-sulfonic acid esters, 2,2',4,4'-tetrahydroxybenzophenone 1,2-naphthoquinonediazide-5-sulfonic acid esters, 2,3,4,4'-tetrahydroxy-benzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinone-diazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups i.e. about 2 to 6 hydroxyl groups, are most preferred.

Among these most preferred 1,2-naphthoquinone-5-diazide compounds are 2,3,4-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, and 2,2',4,4'-tetrahydroxybenzophenone 1,2-naphthoquinonediazide-5-sulfonic acid esters. These 1,2-quinonediazide compounds may be used alone or in combination of two or more.

The proportion of the light sensitizer compound in the light-sensitive mixture may preferably range from about 5 to about 30%, more preferably from about 10 to about 25% by weight of the non-volatile (e.g. non-solvent) content of the light-sensitive mixture. The proportion of total binder resin of this present invention in the light-sensitive mixture may preferably range from about 70 to about 95%, more preferably, from about 75 to 90% of the non-volatile (e.g. excluding solvents) content of the light-sensitive mixture.

These light-sensitive mixtures may also contain conventional photoresist composition ingredients such as other resins, solvents, actinic and contrast dyes, anti-striation agents, plasticizers, speed enhancers, and the like. These additional ingredients may be added to the binder resin and sensitizer solution before the solution is coated onto the substrate.

Other binder resins may also be added. Examples include phenolic-formaldehyde resins, cresol-formaldehyde resins, phenol-cresol-formaldehyde resins and polvinylphenol resins commonly used in the photoresist art. If other binder resins are present, they will replace a portion of the binder resins of the present invention. Thus, the total amount of the binder resin in the photosensitive composition will be from about 60% to about 95% by weight of the total non-volatile solids content of the photosensitive composition.

The resins and sensitizers may be dissolved in a solvent or solvents to facilitate their application to the substrate. Examples of suitable solvents include ethyl cellosolve acetate, n-butyl acetate, xylene, ethyl lactate, propylene glycol alkyl ether acetates, or mixtures thereof and the like. The preferred amount of solvent may be from about 50% to about 500%, or higher, by weight, more preferably, from about 100% to about 400% by weight, based on combined resin and sensitizer weight.

Actinic dyes help provide increased resolution by inhibiting back scattering of light off the substrate. This back scattering causes the undesirable effect of optical notching, especially where the substrate is highly reflective or has topography. Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the light-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to ten percent weight levels, based on the combined weight of resin and sensitizer.

Anti-striation agents level out the photoresist coating or film to a uniform thickness. Anti-striation agents may be used up to five percent weight levels, based on the combined weight of resin and sensitizer. One suitable class of anti-striation agents is non-ionic silicon-modified polymers. Non-ionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-($\beta$-chloroethyl)-ester; stearic acid; dicamphor; polypropylene; acetal resins; phenoxy resins; and alkyl resins up to ten percent weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e. in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20 percent, based on the combined weight of resin and sensitizer.

The prepared light-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° to 115° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of alkali metal hydroxides and silicates or ethanolamine.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

SYNTHESIS EXAMPLE 1

2,6-Bis(Hydroxymethyl)-p-Cresol/4-Chlororesorcinol Novolak (1.0:1.05 Mole Ratio)

2,6-Bis(hydroxylmethyl)-p-cresol (30 g, 0.178 moles), 4-chlororesorcinol (27.07 g, 0.187 moles) and p-toluenesulfonic acid monohydrate (0.8 g, 0.0042 moles) were heated at 87°–90° C. for four hours in 60 mL of stirred 2-ethoxyethanol. The reaction mixture was diluted with 250 mL 2-ethoxyethanol and added dropwise to 2.4 L of stirred $H_2O$. The solid was collected by filtration, reslurried in 400 mL $H_2O$, and stirred overnight. The polymer was again collected, reslurried, and filtered. The reslurrying operation was repeated twice more. The polymer was vacuum dried to yield 50.33 g. See Tables 1 and 2 for glass transition temperature and alkaline dissolution data. The ortho-, ortho-linkages of the alternating copolymers and the terminal groups were identified by $^{13}C$ NMR analysis.

SYNTHESIS EXAMPLE 1A

The same novolak (24.47 g) was prepared with the relative stoichiometry of Example 1 using the procedure in Example 2. See Tables 1 and 2 for glass transition temperature and alkaline dissolution data.

SYNTHESIS EXAMPLE 2

2,6-Bis(Hydeoxymethyl)-p-Cresol/4-Chlororesorcinol Novolak (1:1.02 Mole Ratio)

2,6-Bis(hydroxymethyl)-p-cresol (15 g, 0.089 moles) 4-chlororesorcinol (13.15 g, 0.091 moles) and p-toluenesulfonic acid monohydrate (0.4 g, 0.0021 moles) were heated in 30 mL of mildly refluxing ethanol for 3.7 hours. The reaction mixture was diluted with about 60 mL ethanol and added dropwise to about 400 mL of rapidly stirring water. The precipitated polymer was collected by filtration, reslurried and refiltered 3–4 times and vacuum dried to yield 21.53 g polymer. See Tables 1 and 2 for glass transition and alkaline dissolution data.

SYNTHESIS EXAMPLE 3

2,6-Bis(Hydorxymethyl)-p-Cresol/4-Chlororesorcinol Novolak (1:0.85 Mole Ratio)

2,6-Bis(hydroxymethyl)-p-cresol (25 g, 0.149 moles), 4-chlororesorcinol (18.26 g, 0.126 moles) and p-toluenesulfonic acid monohydrate (0.67 g, 0.0035 moles) were heated for 5.5 hours at 65°–70° C. in 37 mL 2-ethoxyethanol. The reaction mixture was diluted with 125 mL 2-ethoxyethanol and added dropwise to 1.5 L rapidly stirring $H_2O$. The solid was collected by filtration, reslurried in 1 L $H_2O$ and refiltered. This process was repeated twice and the solid vacuum dried to yield 38.49 g. See Tables 1 and 2 for glass transition and alkaline dissolution data. The ortho-, ortho-linkages of the alternating copolymers and the terminal groups were identified by $^{13}C$ NMR analysis.

SYNTHESIS EXAMPLE 4

2,6-Bis(Hydroxymethyl)-p-Cresol/4-Chlororesorcinol Novolak (1:0.65 Mole Ratio)

2,6-Bis(hydroxymethyl)-p-cresol (25.00 g, 0.149 moles), 4-chlororesorcinol (13.96 g, 0.09 moles) and p-toluenesulfonic acid monohydrate (0.67 g, 0.0035 moles) were reacted four hours isolated as described in Synthesis Example 3 to yield 35 g of novolak. See Tables 1 and 2 for glass transition and alkaline dissolution data. The ortho-, ortho-linkages of the alternating copolymers and the terminal groups were identified by $^{13}C$ NMR analysis.

SYNTHESIS EXAMPLE 5

2,6-Bis(Hydroxymethyl)-p-Cresol/4-Chlororesorcinol 3-Methoxyphenol Novolak (1:0.85:0.20 Mole Ratio)

2,6-Bis(hydroxymethyl)-p-cresol (25.00 g, 0.149 moles), 4-chlororesorcinol (18.26 g, 0.127 moles), 3-methoxyphenol (3.69 g, 0.03 moles) and p-toluenesulfonic acid monohydrate (0.67 g, 0.0035 moles) were reacted four hours isolated as described in Example 3 (except an additional reslurry/filtration step was added) to yield 40.4 g novolak. See Tables 1 and 2 for glass transition and alkaline dissolution data. The ortho-, ortho-linkages of the alternating copolymers and the terminal groups were identified by $^{13}C$ NMR analysis.

SYNTHESIS EXAMPLE 6

2,6-Bis(Hydroxymethyl)-p-Cresol/4-Chlororesorcinol 3-Methoxyphenol Novolak (1:0.6:0.45 Mole Ratio)

Example 5 was repeated except for changing the relative proportions of 4-chlororesorcinol (12.90 g, 0.089 moles) and 3-methoxyphenol (8.3 g, 0.067 moles) to yield 39.7 g of novolak. See Tables 1 and 2 for glass transition and alkaline dissolution data. The ortho-, ortho-linkages of the alternating copolymers and the terminal groups were identified by $^{13}C$ NMR analysis.

SYNTHESIS EXAMPLE 7

2,6-Bis(Hydroxymethyl)-p-Cresol/4-Chlororesorcinol 4-Methoxyphenol Novolak (1:0.85:0.20 Mole Ratio)

Example 5 was repeated except 3-methoxyphenol was replaced by 4-methoxyphenol. The yield was 40.8 g. See Tables 1 and 2 for glass transition and alkaline dissolution data. The ortho-, ortho-linkages of the alternating copolymers and the terminal groups were identified by $^{13}C$ NMR analysis.

SYNTHESIS EXAMPLE 8

2,6-Bis(Hydroxymethyl)-p-Cresol/4-Chlororesorcinol 4-Methoxyphenol Novolak (1:0.6:0.45 Mole Ratio)

Example 6 was repeated except 3-methoxyphenol was replaced by 4-methoxyphenol. The yield was 39.7 g. See Tables 1 and 2 for glass transition and alkaline dissolution data. The ortho-, ortho-linkages of the alternating copolymers and the terminal groups were identified by $^{13}C$ NMR analysis.

SYNTHESIS EXAMPLES 9-13

2,6-Bis(Hydroxymethyl)-p-Cresol/4-Chlororesorcinol 4-Methoxyphenol Novolaks 2,6-Bis(hydroxymethyl)-p-cresol (30 g, 0.178 moles) (BHMPC), 4-chlororesorcinol (see Table 3), 4-methoxyphenol (see Table 3), and p-toluenesulfonic acid monohydrate (0.8 g, 0.0042 moles) were reacted in 60 ml 2-ethoxyethanol at 90°-95° C. for approximately 4 hours. The solutions were diluted with 250 mL of 2-ethoxyethanol and added dropwise to 2.4 L rapidly stirring $H_2O$. The polymer was collected by filtration, washed 3-4 times with $H_2O$ and vacuum dried. See Table 3 for yields. See Tables 1 and 2 for glass transition and alkaline dissolution data.

SYNTHESIS COMPARISON 1

Meta-, Para-Cresol Novolak

A reference meta-, para-cresol novolak was prepared using the basic procedure outlined in Example 1 in U.S. Pat. No. 4,371,631 using a feedstock of approximately 45% m-cresol and 55% p-cresol. This was a random copolymer and was not an alternating copolymer like those novolaks of Examples 1-13. The m-cresol units may link with each other and p-cresol groups may link with each other by methylene linkages. Thus, adjacent groups in the polymer chain may be the same groups.

TABLE 1

| Synthesis Example | Tg (°C.) |
|---|---|
| 1 | Note ① |
| 1A | 176 |
| 2 | 186 |
| 3 | Note ① |
| 4 | Note ① |
| 5 | Note ① |
| 6 | Note ① |
| 7 | Note ① |
| 8 | Note ① |
| 9 | 173 |
| 10 | 132 |
| 11 | 142 |
| 12 | 151 |
| 13 | 120 |

TABLE 1-continued

| Synthesis Example | Tg (°C.) |
|---|---|
| Comparison 1 | 107 |

Note ①: Glass transition temperature measured up to 200° C. These novolaks did not have an observed glass transition temperature over the measured range and are assumed to have higher glass transition temperatures than 200° C.

TABLE 2

| Synthesis Example | Dissolution Time (sec) ①② | Dissolution Time (sec) ①③ | Dissolution Time (sec) ①④ |
|---|---|---|---|
| 1 | — | 13 | 6 |
| 1A | 6 | — | — |
| 2 | 8 | — | — |
| 3 | — | 37 | 6 |
| 4 | — | 200 | 17 |
| 5 | — | 22 | 8 |
| 6 | — | 49 | DND⑤ |
| 7 | — | 17 | 7 |
| 8 | — | 52 | 39⑥a |
| 10 | — | — | 7⑥a |
| 11 | — | — | 18⑥b |
| 12 | — | — | 74⑥c |
| 13 | — | — | 8 |
| Comparison 1 | 60 | 63 | 50 |

① approximately 1 μm thick film
② LSI developer, a Sodium Silicate/$Na_3PO_4$ developer, available from Olin Hunt Specialty Products, Inc. of East Providence, Rhode Island (diluted 1:1 by volume with water).
③ 0.123 N NaOH
④ 0.3 N tetramethylammonium hydroxide
⑤ Did not dissolve completely
⑥ Dissolution times were normalized to that expected for 1 μm thickness from thicker films of
$^a$2.1 microns,
$^b$2.45 microns,
$^c$1.2 microns

TABLE 3

| | 4-chloroesorcinol (4-CR) | | 4-methoxyphenol (4-MP) | | yield | Weight Ratio | Mole Ratio |
|---|---|---|---|---|---|---|---|
| Example | g | mole | g | mole | g | BHMPC:4-CR + 4-MP | BHMPC:4-CR:4-MP |
| 9 | 20.63 | 0.143 | 8.86 | 0.071 | 53 | 1:0.98 | 1:0.80:0.40 |
| 10 | 15.47 | 0.107 | 18.82 | 0.152 | 52.8 | 1:1.14 | 1:0.6:0.85 |
| 11 | 15.47 | 0.107 | 14.39 | 0.116 | 50.4 | 1:1.1 | 1:0.6:0.65 |
| 12 | 14.18 | 0.098 | 14.39 | 0.116 | 50.3 | 1:0.95 | 1:0.55:0.65 |
| 13 | 14.18 | 0.098 | 18.82 | 0.152 | 52.2 | 1:1.1 | 1:0.55:0.85 |

TABLE 1

The data in Table 1 shows that novolaks prepared by this invention exhibit high glass transition temperatures relative to conventional novolaks used in photoresist. (Comparison 1 vs. Examples 1-13). Also, Examples 9-12 show that as the molar ratio of 4-chlororesorcinol to methoxyphenol in the feed decreases, the glass transition temperature of the resulting novolak decreases. However, the $T_g$'s remain high relative to Comparison 1. The advantage of these high glass transition temperatures is that they will result in improved photoresists with higher resistance to thermal flow.

TABLE 2

The data in Table 2 shows that novolak resins of the present invention as prepared by Examples 1-8 and 10-13 exhibit relatively high alkaline solubility in common photoresist developers. In most cases shown, the time for dissolving these resins (1 μm thickness) was faster than as similar to that of a resin coating of known cresol/formaldehyde novolak. Looking at the first Dissolution Time column, the resins produced by Examples 1A and 2 were much more soluble in a sodium silicate/-$Na_3PO_4$ developer than the known novolak. In the second column, resins of Examples 1, 3 and 5–8 were faster than the known novolak. Example 4 was slower. It is believed that this slow rate was due to an undesirable (but not fully understood) cation effect between the resin and the developer. In the third Dissolution Time column, the resins of Examples 1, 3–5, 7, 8, 10, 11 and 13 were faster than the control. The reason why the resin of Example 6 did not fully dissolve in the tetramethylammonium hydroxide is not fully known, but is believed to be caused by an unwanted cation effect. Example 12 in this column has a slightly slower dissolution time than the control. It is believed this was caused by the particular mole ratio of reactants employed.

TABLE 3

Table 3 shows the weight and molar quantities and ratios of 4-chlororesorcinol and 4-methoxyphenol used to prepare novolaks in Examples 9–13. Also shown is the weight yield of each novolak.

APPLICATION EXAMPLE 1

The novolak resin in Synthesis Example 1 (3 parts) and the condensation product of 1.4 equivalents of 1,2 naphthoquinone-2-diazide-5-sulfonyl chloride with 1 equivalent 2,3,4-trihydroxybenzophenone (1 part) were dissolved in propylene glycol methyl ether acetate and microfiltered. The resist was spun cast upon silicon or silicon dioxide wafers and baked at 100° for thirty minutes in a convection oven.

The solids content was adjusted to yield about one micron thick films. The resist was exposed on a Canon PLA 501F Aligner through a variable density mask (Optoline Type 2) and immersion developed for 60 seconds. For data see Tables 4 and 5.

APPLICATION EXAMPLES 2–7

The novolaks in Synthesis Examples 3–8 were formulated and tested as in Example 1. For data see Tables 4 and 5.

APPLICATION COMPARISON 1

The novolak in Synthesis Comparison 1 was formulated and tested as in Application Example 1 except the solvent was 85% by weight ethyl cellulose acetetate, 6.5% by weight n-butyl acetate and 8.5% by weight xylene. For data see Tables 4 and 5.

TABLE 4

(Tetramethylammonium Hydroxide Developer)

| Application Example | Synthesis Example | Developer Normality | Unexposed Film Loss (Å) | Sensitivity②.③ (mJ/cm$^2$) |
|---|---|---|---|---|
| 1 | 1 | 0.084 | 250 | 75 |
| 2 | 3 | 0.084 | 275 | 75 |
| 3 | 4 | 0.210 | 475 | 70 |
| 4 | 5 | 0.108 | 400 | 75 |
| 5 | 6 | 0.600 | ① | — |
| 6 | 7 | 0.108 | 325 | 63 |
| 7 | 8 | 0.600 | 0 | 100 |
| Comparison 1 | Comparison 1 | 0.284 | 300 | 43 |

① A thin film of resist remained undissolved independent of exposure.
② Clean, well formed images were obtained only from Example 2 and Comparison 1.
③ Exposure dose was measured at 436, 400 and 365 nm and then summed.

TABLE 5

(Sodium Hydroxide Developer ①)

| Application Example | Synthesis Example | Developer Normality | Unexposed Film Loss (Å) | Sensitivity② (mJ/cm$^2$) |
|---|---|---|---|---|
| 1 | 1 | 0.031 | 350 | 125 |
| 2 | 3 | 0.050 | 375 | 125 |
| 3 | 4 | 0.135 | 100 | 75 |
| 4 | 5 | 0.036 | 300 | 125 |
| 5 | 6 | 0.063 | 100 | 94 |
| 6 | 7 | 0.036 | 125 | 113 |
| 7 | 8 | 0.075 | 250 | 75 |
| Comparison 1 | Comparison 1 | 0.093 | 40 | 55 |

① All images were cleaned and well formed.
② Exposure dose was measured at 436, 400 and 365 nm and then summed.

TABLE 4

Table 4 shows the unexposed film loss and sensitivity of photoresist films, formulated from novolaks described in Examples 1 and 3–8, after exposure to UV radiation and subsequent latent image development with tetramethylammonium hydroxide developer. All the Examples except Example 5 showed relatively desirable results in that the sensitivities of each Example were reasonable (i.e. less than about 125 mJ/cm$^2$) while the unexposed film loss was held under 5% of the original 1 micron film thickness. It is not fully known why the film in Application Example 5 did not completely develop, but it is believed this was caused by a cation effect between the resin and the developer (See Table 2, column 3, Example 6).

TABLE 5

Table 5 shows the unexposed film loss and sensitivity of photoresist films, formulated from novolaks described in Examples 1 and 3–8, after exposure to UV radiation and subsequent latent image development with sodium hydroxide developer. All the Examples showed relatively desirable results in that the sensitivities of each Example were reasonable (i.e. less than about 125 mJ/cm$^2$) while the unexposed film loss was held under 5% of the original 1 micron film thickness.

Application Examples 8, 10 and 11 illustrate that different developers can be used with this invention. Application Example 9 illustrates the excellent stability to thermal deformation of this invention. Example 11 also shows that different photoactive compounds may be used in formulations of photosensitive compositions of this invention.

APPLICATION EXAMPLE 8

(Different Novolak to o-Naphthoquinone Diazide Ratio and Different Developer)

Resists using novolaks prepared in Synthesis Examples 1A and 2 were formulated as in Application Example 1 except in a 4:1 novolak to o-naphthoquinone diazide ratio. The resists were then mixed in a 32%:68% ratio respectively. The resist was processed as described in Application Example 1 using a 90 second immersion development in 80% HPRD-411, an ethanolamine-based developer made by Olin Hunt Specialty Products, Inc. of East Providence, R.I. Resist films were exposed on a MICRALIGN 111 from Perkin-Elmer using a variable density mask. Unexposed film loss was 550 Å with a sensitivity of 77 mJ/cm$^2$. The images were generally clean.

APPLICATION EXAMPLE 9

(Different Imaging Apparatus Than Application Example 8—Thermal Properties Measured)

An Ultratech Stepper 1000 was used to expose the resist in Application Example 8. The resist was developed as described in Application Example 8. Unexposed film loss was 200 Å. Images approximately 1.25 microns generated in this manner were subjected to a convection oven bake of 198°, 228° or 252° for thirty minutes. Images under all three heating conditions showed no visible signs of deformation by scanning electron micrograph. Exposure was 196 mJ/cm². Typical positive-working resists based on novolaks and o-naphthoquinone diazide ester sensitizers show image deformation at about 130° C. or below.

APPLICATION EXAMPLE 10

(Raised Developer Strength and Lowered Developing Times With Different Novolak)

The novolak from Synthesis Example 10 was formulated and tested as in Application Example 1. When the resist was developed for 60 seconds in 0.3N tetramethylammonium hydroxide, unexposed film loss was about 300 521 and photosensitivity was about 125 mJ/cm². Images were of poor quality. Cleaner, improved quality images were obtained using a 0.36N tetramethylammonium hydroxide developer in a twenty second immersion process. Photosensitivity remained at about 125 mJ/cm² with no unexposed film loss. Excellent images were obtained with LSI developer diluted 1:3 by volume with water (a sodium silicate/sodium phosphate developer from Olin Hunt Specialty Products). Photosensitivity was 100 mJ/cm² with an unexposed film loss of about 150 Å.

APPLICATION EXAMPLE 11

(Different Sensitizer)

The novolak from Synthesis Example 11 was formulated and tested as in Application Example 1. The photoactive component of the resist consisted of a 50:50 (W:W) mixture of the condensation products of 2,3,4-trihydroxybenzophenone and 2,3,4-trihydroxyacetophenone with approximately three equivalents each of 1,2-naphthoquinone-2-diazide-5-sulfonyl chloride. Clean images were obtained using 0.36N tetramethylammonium hydroxide developer for thirty seconds at an exposure of 138 mJ/cm². No film loss was observed.

What is claimed is:

1. The process of developing an image-wise exposed photoresist-coated substrate comprising:
   (1) coating said substrate with a light-sensitive composition useful as a positive working photoresist, said composition comprising an admixture of o-quinonediazide compound and a binder resin comprising at least about 40% by weight of units of the formula (I):

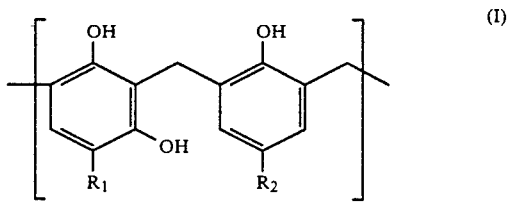

wherein $R_1$ is a halogen atom and $R_2$ is a lower alkyl group having 1 to 4 carbon atoms, the amount of said o-quinonediazide compound being about 5% to about 30% by weight and the amount of said binder resin being about 60% to 95% by weight, based on the total solid content of said photosensitive composition;

(2) subjecting said coating on said substrate to an image-wise exposure of radiant light energy; and
   (3) subjecting said image-wise exposed coated substrate to a developing solution wherein the exposed areas of said light-exposed coating are dissolved and removed from the substrate, thereby resulting in positive image-wise pattern in the coating.

2. The process of claim 1 wherein said radiant light energy is ultraviolet light.

3. The process of claim 1 wherein said developing solution comprises an aqueous solution of an alkali metal hydroxide or silicates or ethanolamine.

* * * * *

UNITED STATES PATENT AND TRADEMARK OFFICE
CERTIFICATE OF CORRECTION

PATENT NO. : 5,024,921

DATED : June 18, 1991

INVENTOR(S) : Andrew J. Blakeney; Alfred T. Jeffries, III; Thomas R. Sarubbi It is certified that error appears in the above-identified patent and that said Letters Patent is hereby corrected as shown below:

In Column 15, line 26 delete "521" and insert --$\overset{O}{A}$--.

In Column 16, line 12 insert --photosensitive--.

Signed and Sealed this

Twenty-third Day of February, 1993

Attest:

STEPHEN G. KUNIN

*Attesting Officer*      *Acting Commissioner of Patents and Trademarks*